United States Patent
Lee et al.

(10) Patent No.: US 10,062,865 B2
(45) Date of Patent: Aug. 28, 2018

(54) ORGANIC LIGHT-EMITTING DISPLAY APPARATUS

(71) Applicant: Samsung Display Co., Ltd., Yongin-si, Gyeonggi-do (KR)

(72) Inventors: Minsu Lee, Yongin-si (KR); Maidanchuk Ivan, Yongin-si (KR); Seungrok Lee, Yongin-si (KR); Wonbaek Lee, Yongin-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 15/365,591

(22) Filed: Nov. 30, 2016

(65) Prior Publication Data
US 2018/0019439 A1    Jan. 18, 2018

(30) Foreign Application Priority Data
Jul. 13, 2016 (KR) ........................ 10-2016-0088597

(51) Int. Cl.
*H01L 51/52* (2006.01)
*H01L 27/32* (2006.01)

(52) U.S. Cl.
CPC ...... *H01L 51/5253* (2013.01); *H01L 27/3262* (2013.01); *H01L 51/5203* (2013.01); *H01L 51/5237* (2013.01)

(58) Field of Classification Search
CPC ............. H01L 51/5253; H01L 51/5203; H01L 51/5237; H01L 27/3262
See application file for complete search history.

(56) References Cited

U.S. PATENT DOCUMENTS

| | | | |
|---|---|---|---|
| 7,580,014 B2* | 8/2009 | Tanaka | G09G 3/325 345/76 |
| 7,960,910 B2 | 6/2011 | Suh | |
| 8,098,008 B2* | 1/2012 | Kim | H01L 51/5228 313/504 |
| 8,125,143 B2* | 2/2012 | Park | H01L 51/5281 313/504 |
| 8,237,354 B2* | 8/2012 | Kim | G06F 3/0412 313/503 |

(Continued)

FOREIGN PATENT DOCUMENTS

KR   10-2007-0111002 A   11/2007
KR   10-2011-0059304 A   6/2011

(Continued)

*Primary Examiner* — Ida M Soward
(74) *Attorney, Agent, or Firm* — Innovation Counsel, LLP

(57) ABSTRACT

An organic light-emitting display apparatus includes: a substrate; a pixel electrode above the substrate; an intermediate layer above the pixel electrode and including an organic emission layer; an opposite electrode above the intermediate layer; and an encapsulation structure above the opposite electrode and including at least one inorganic film and at least one organic film. A difference between a refractive index of the at least one inorganic film and a refractive index of the at least one organic film is in a range between about 0.3 to about 0.5. A thickness of the at least one inorganic film is in a range of about 0.7 μm to about 1.5 μm. A thickness of the at least one organic film is in a range of about 3.5 μm to about 6.5 μm.

18 Claims, 8 Drawing Sheets

(56) References Cited

U.S. PATENT DOCUMENTS

| | | | |
|---|---|---|---|
| 8,247,819 B2* | 8/2012 | Kim | H01L 51/5206 257/59 |
| 9,048,459 B2 | 6/2015 | Cho et al. | |
| 2010/0148192 A1* | 6/2010 | Jung | H01L 27/3246 257/88 |
| 2011/0037061 A1* | 2/2011 | Yamazaki | H01L 51/5016 257/40 |
| 2011/0163330 A1* | 7/2011 | Kim | H01L 51/5256 257/88 |
| 2014/0034919 A1* | 2/2014 | Park | H01L 51/5275 257/40 |
| 2015/0014663 A1* | 1/2015 | Kwak | H01L 51/5253 257/40 |
| 2015/0048355 A1* | 2/2015 | Kashiwabara | H01L 27/3244 257/40 |
| 2015/0198853 A1* | 7/2015 | Park | H01L 27/124 349/137 |
| 2016/0048047 A1 | 2/2016 | Pyo et al. | |
| 2016/0093828 A1 | 3/2016 | Kim et al. | |
| 2016/0122600 A1 | 5/2016 | Moon et al. | |
| 2016/0378224 A1* | 12/2016 | Kwon | H01L 51/5256 345/174 |
| 2016/0380235 A1* | 12/2016 | Kim | H01L 51/0061 257/40 |
| 2017/0047379 A1* | 2/2017 | Yim | H01L 51/5253 |
| 2017/0092885 A1* | 3/2017 | Sakuishi | H01L 51/0097 |
| 2017/0125497 A1* | 5/2017 | Kim | H01L 27/3248 |
| 2017/0243525 A1* | 8/2017 | Morikawa | G09F 9/30 |

FOREIGN PATENT DOCUMENTS

| | | |
|---|---|---|
| KR | 10-2014-0056498 A | 5/2014 |
| KR | 10-2014-0083411 A | 7/2014 |
| KR | 10-2016-0036722 A | 4/2016 |

\* cited by examiner

ORGANIC LIGHT-EMITTING DISPLAY APPARATUS

CROSS-REFERENCE TO RELATED APPLICATION

This application claims the benefit of Korean Patent Application No. 10-2016-0088597, filed on Jul. 13, 2016, in the Korean Intellectual Property Office, the disclosure of which is incorporated herein in its entirety by reference.

BACKGROUND

1. Field

One or more embodiments relate to an organic light-emitting display apparatus, and more particularly, to an organic light-emitting display apparatus capable of reducing reflection of external light.

2. Description of the Related Art

An organic light-emitting display apparatus is a self-emission display apparatus and includes a plurality of organic light-emitting devices (OLEDs) each including a hole injection electrode, an electron injection electrode, and an organic emission layer therebetween. Holes injected from the hole injection electrode recombine with electrons injected from the electron injection electrode in the organic emission layer to produce excitons. These excitons transit from an excited state to a ground state, thereby generating light.

The organic light-emitting display apparatus, which is a self-emission display apparatus, requires no separate light source. Thus, the organic light-emitting display apparatus may be driven at a low voltage and may be manufactured to have a light weight and a slim profile. In addition, the organic light-emitting display apparatus has a wide viewing angle, a high contrast ratio, and a short response time. Accordingly, the organic light-emitting display apparatus is widely applied to various fields, for example, personal portable devices such as MP3 players or mobile phones, televisions, and the like.

Recently, in order to manufacture a slim and/or flexible organic light-emitting display apparatus, a thin film encapsulation (TFE) including at least one inorganic film and at least one organic film has been used to seal an OLED.

SUMMARY

One or more embodiments include an organic light-emitting display apparatus capable of reducing reflection of external light without any separate additional processes.

Additional aspects will be set forth in part in the description which follows and, in part, will be apparent from the description, or may be learned by practice of the presented embodiments.

According to one or more embodiments, an organic light-emitting display apparatus includes: a substrate; a pixel electrode above the substrate; an intermediate layer above the pixel electrode and including an organic emission layer; an opposite electrode above the intermediate layer; and an encapsulation structure above the opposite electrode and including at least one inorganic film and at least one organic film, wherein a difference between a refractive index of the at least one inorganic film and a refractive index of the at least one organic film may be in a range between about 0.3 to about 0.5, a thickness of the at least one inorganic film may be in a range of about 0.7 µm to about 1.5 µm, and a thickness of the at least one organic film may be in a range of about 3.5 µm to about 6.5 µm.

The encapsulation structure may include a first inorganic film, a first organic film, and a second inorganic film, which are sequentially stacked above the opposite electrode.

The at least one inorganic film may include silicon nitride ($SiN_x$).

The organic light-emitting display apparatus may further include: a capping layer between the opposite electrode and the encapsulation structure and contacting with the opposite electrode; and a cover layer above the capping layer.

The thickness of the at least one organic film may be about 6 µm, and the thickness of the at least one inorganic film may be about 1 µm.

The at least one inorganic film may be in an uppermost portion of the encapsulation structure, and the refractive index of the at least one inorganic film may be in a range of about 1.85 to about 1.95.

The organic light-emitting display apparatus may further include a buffer layer above the encapsulation structure and contacting with the at least one inorganic film.

A thickness of the buffer layer may be in a range of about 50 nm to about 80 nm, and a refractive index of the buffer layer may be in a range of about 1.33 to about 1.5.

The buffer layer may include silicon oxynitride (SiON), silicon oxide ($SiO_2$), or an organic material.

The encapsulation structure may include a first inorganic film, a first organic film, a second inorganic film, a second organic film, and a third inorganic film, which are sequentially stacked above the opposite electrode.

The organic light-emitting display apparatus may further include a pixel defining film including an opening exposing at least a portion of the pixel electrode.

The pixel electrode may be a reflective electrode configured to reflect light, and the opposite electrode may be a transparent or translucent electrode configured to transmit at least a part of light.

According to one or more embodiments, an organic light-emitting display apparatus includes: a substrate; a pixel electrode above the substrate; an intermediate layer above the pixel electrode and including an organic emission layer; an opposite electrode above the intermediate layer; an encapsulation structure above the opposite electrode and including at least one inorganic film and at least one organic film; and a buffer layer above the encapsulation structure, wherein a thickness of the at least one inorganic film is in a range of about 0.7 µm to about 1.5 µm, a thickness of the at least one organic film is in a range of about 3.5 µm to about 6.5 µm, and a thickness of the buffer layer is in a range of about 50 µm to about 80 µm.

A difference between a refractive index of the at least one inorganic film and a refractive index of the at least one organic film may be in a range of about 0.3 to about 0.5, and a refractive index of the buffer layer may be less than the refractive index of the at least one inorganic film.

The refractive index of the at least one inorganic film may be in a range of about 1.85 to about 1.95, the refractive index of the at least one organic film may be in a range of about 1.45 to about 1.55, and the refractive index of the buffer layer may be in a range of about 1.33 to about 1.5.

The at least one inorganic film may include silicon nitride ($SiN_x$).

The buffer layer may include silicon oxynitride (SiON), silicon oxide ($SiO_2$), or an organic material.

The organic light-emitting display apparatus may further include: a capping layer between the opposite electrode and the encapsulation structure and contacting with the opposite electrode; and a cover layer above the capping layer.

The encapsulation structure may include a first inorganic film, a first organic film, and a second inorganic film, which are sequentially stacked above the opposite electrode.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
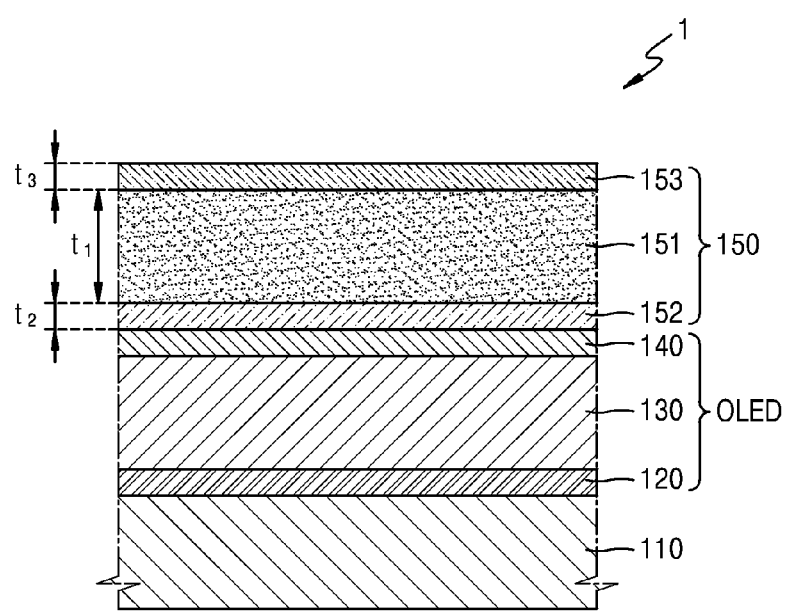
FIG. 1 is a schematic cross-sectional view of an organic light-emitting display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

Various alterations and modifications may be made to embodiments, some of which will be illustrated in detail in the drawings and detailed description. The effects and features, and methods of achieving the effects and features will become apparent from the embodiments described below in detail with reference to the accompanying drawings. However, the inventive concept is not limited to the following embodiments and may be realized in various forms.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be understood that the terms "comprise", "include", and "have" used herein specify the presence of stated features or elements, but do not preclude the presence or addition of one or more other features or elements.

Sizes of elements in the drawings may be exaggerated for convenience of explanation. For example, since sizes and thicknesses of components in the drawings are arbitrarily illustrated for convenience of explanation, the following embodiments are not limited thereto.

Hereinafter, embodiments will be described in detail with reference to the accompanying drawings. Like reference numerals are assigned to like elements throughout the drawings and the specification, and redundant descriptions thereof will be omitted.

Figure 2:
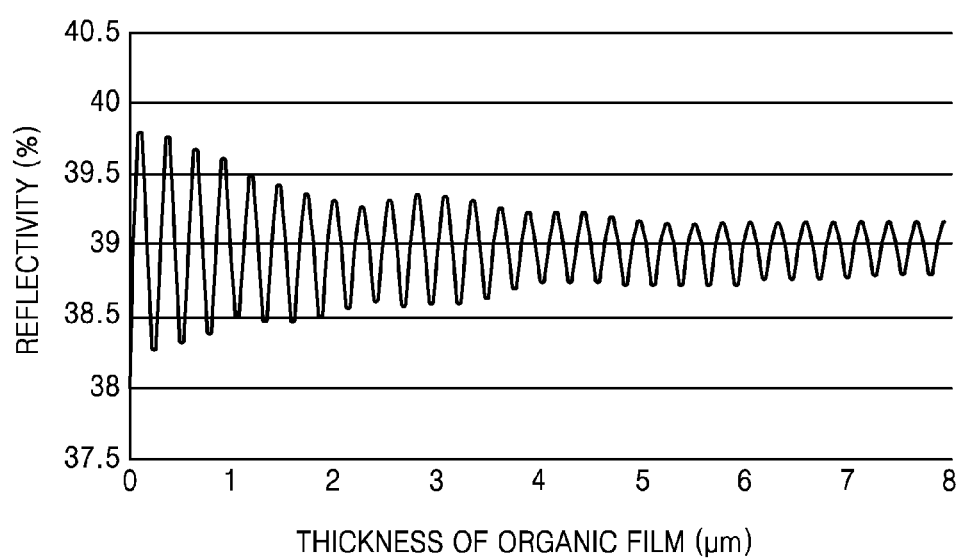
FIG. 2 is a graph showing reflectivity of external light with respect to a thickness of an organic film included in an encapsulation structure of FIG. 1.

FIG. 1 is a schematic cross-sectional view of an organic light-emitting display apparatus 1 according to an embodiment, and FIG. 2 is a graph showing reflectivity of external light with respect to a thickness of an organic film included in an encapsulation structure 150 of FIG. 1.

Referring to FIG. 1, the organic light-emitting display apparatus 1 according to an embodiment may include: a substrate 110; a pixel electrode 120 above the substrate 110; an intermediate layer 130 above the pixel electrode 120, including an organic emission layer; an opposite electrode 140 above the intermediate layer 130; and an encapsulation structure 150 above the opposite electrode 140, including at least one inorganic film 152 and 153 and at least one organic film 151, wherein a difference between a refractive index of the at least one inorganic film 152 and 153 and a refractive index of the at least one organic film 151 may be in a range of about 0.3 to about 0.5, and a thickness $t_1$ of the at least one organic film 151 may be in a range of about 3.5 μm to about 6.5 μm.

The substrate 110 may include various materials, such as glass, metal, or plastic. According to an embodiment, the substrate 110 may include a flexible substrate. The flexible substrate refers to a substrate that is well bendable, foldable, or rollable. The flexible substrate may include ultra-thin glass, metal, or plastic. For example, when the plastic is used, the substrate 110 may include a polymer resin, such as polyethersulphone (PES), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), or cellulose acetate propionate (CAP).

An organic light-emitting device (OLED) may be above the substrate 110, and the OLED may include the pixel electrode 120, the intermediate layer 130, and the opposite electrode 140.

The pixel electrode 120 may be a reflective electrode including a reflection layer. According to an embodiment, the reflection layer may include at least one selected from the group consisting of silver (Ag), magnesium (Mg), aluminum (Al), platinum (Pt), palladium (Pd), gold (Au), nickel (Ni), neodymium (Nd), iridium (Ir), and chromium (Cr). A transparent or translucent electrode layer may be further arranged above the reflection layer. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (IZO). For example, the pixel electrode 120 may include three layers of ITO/Ag/ITO.

The opposite electrode 140 may include various conductive materials and may be a transparent or translucent electrode. According to an embodiment, the opposite electrode 140 may include one or more materials selected from the group consisting of silver (Ag), aluminum (Al), ytterbium (Yb), titanium (Ti), magnesium (Mg), nickel (Ni), lithium (Li), calcium (Ca), copper (Cu), LiF/Ca, LiF/Al, MgAg, and CaAg. The one or more materials may be a thin film having a thickness of several nanometers to tens of nanometers and may transmit light.

That is, the organic light-emitting display apparatus 1 according to the embodiment may be a top-emission type display apparatus that emits light from the intermediate layer 130 toward the encapsulation structure 150.

The intermediate layer 130 may include an organic emission layer and may further include a common layer. Details thereof will be described later. According to an embodiment, the OLED may emit red light, green light, or blue light according to a type of the organic emission layer. However, embodiments are not limited thereto. The OLED may emit other color light or white light.

In a case where the OLED emits white light, the organic emission layer may have a structure in which different types of organic emission layers are stacked, or may be a layer in which different organic materials are mixed.

The encapsulation structure 150 may be above the OLED, and the encapsulation structure 150 may include the at least one inorganic film 152 and 153 and the at least one organic film 151. According to an embodiment, the encapsulation structure 150 may include a first inorganic film 152 above the opposite electrode 140, a first organic film 151 above the first inorganic film 152 and including an organic material, and a second inorganic film 153 above the first organic film 151. FIG. 1 illustrates a case where the at least one inorganic film 152 and 153 is two layers and the at least one organic film 151 is one layer, but embodiments are not limited thereto.

The encapsulation structure 150 may serve to seal the OLED so as to prevent the OLED from being exposed to outside air or foreign substances. Since the encapsulation structure 150 is very thin, the encapsulation structure 150 may be used as an encapsulation member of a flexible display apparatus that is bendable or foldable.

When external light is incident on the organic light-emitting display apparatus 1, the incident external light may be reflected by a wiring or an electrode included in the organic light-emitting display apparatus 1. In this case, a user may perceive the external light as well as an image produced by the organic light-emitting display apparatus 1. That is, when reflectivity of external light is high, image visibility may be deteriorated.

In particular, a case where refractive indices of the first and second inorganic films 152 and 153 included in the encapsulation structure 150 are high may increase reflectivity of external light reflected from an interface between the first and second inorganic films 152 and 153 and the organic film 151 adjacent thereto and an interface between the second inorganic film 153 in the uppermost portion of the encapsulation structure 150 and a layer above the encapsulation structure 150.

According to an embodiment, a difference between a refractive index of the at least one inorganic film 152 and 153 and a refractive index of the at least one organic film 151 in the encapsulation structure 150 may be in a range of about 0.3 to about 0.5. That is, the refractive index of the at least one inorganic film 152 and 153 may be greater than the refractive index of the at least one organic film 151 by 0.3 or more. Accordingly, the reflectivity of external light may be greater in the interface between the at least one inorganic film 152 and 153 and the at least one organic film 151. The reflection of external light may be prevented by using an anti-reflection film such as a circular polarization film above the encapsulation structure 150, but the use of the anti-reflection film alone has a limitation in reducing the reflection of external light.

Referring to FIG. 2, the reflectivity of external light may change according to the thickness $t_1$ of the organic film 151. It can be seen from FIG. 2 that, as the thickness $t_1$ of the organic film 151 increases, external light reflected from the interface between the organic film 151 and the inorganic films 152 and 153 or the like may repeat destructive interference and constructive interference; however, when the thickness $t_1$ of the organic film 151 is less than 3.5 μm, the reflectivity of external light greatly changes even if the thickness $t_1$ of the organic film 151 slightly changes.

Although the organic film 151 is manufactured to have the designed thickness the thickness $t_1$ may have an error of several nanometers to tens of nanometers due to an error during a manufacturing process. Accordingly, the organic film 151 may have a thickness of about 3.5 μm or more so as to obtain stable reflectivity of external light according to the thickness $t_1$ of the organic film 151. In addition, the organic film 151 may have a thickness of about 6.5 μm or less. When the thickness $t_1$ of the organic film 151 is greater than about 6.5 μm, the encapsulation structure 150 becomes thick, and thus, it may be difficult to make the organic light-emitting display apparatus 1 slim and flexible.

According to an embodiment, the inorganic films 152 and 153 may include silicon nitride ($SiN_x$) and may have a refractive index of about 1.85 to about 1.95. The organic light-emitting display apparatus 1 of FIG. 1 may include the first inorganic film 152 and the second inorganic film 153, and both the first inorganic film 152 and the second inorganic film 153 may include silicon nitride ($SiN_x$). However, embodiments are not limited thereto. The first inorganic film 152 and the second inorganic film 153 may include different materials. However, even in this case, a difference between the refractive index of the at least one inorganic film 152 and 153 and the refractive index of the at least one organic film 151 may be in a range of about 0.3 to about 0.5.

That is, the at least one inorganic film 152 and 153 may include a material having a relatively greater refractive index than that of other inorganic films. Due to this, the reflectivity of external light may increase. The at least one inorganic film 152 and 153 may serve to prevent or reduce permeation of foreign substances (e.g., moisture or oxygen) into the OLED.

The organic film 151 may be used together with the inorganic films 152 and 153 to perform a function of improving sealing performance of the encapsulation structure 150, a function of mitigating inner stress of the inorganic films 152 and 153, and a function of compensating defects of the inorganic films 152 and 153 and planarizing uneven surfaces of the inorganic films 152 and 153. The organic film 151 may include various organic materials, such as an epoxy-based resin, an acryl-based resin, or a polyimide-based resin, and the refractive index of the organic film 151 may be in a range of about 1.45 to about 1.55. That is, the refractive index of the organic film 151 may be less than the refractive indices of the inorganic films 152 and 153. A difference between the refractive index of the organic film 151 and the refractive indices of the inorganic films 152 and 153 may be in a range of about 0.3 to about 0.5.

According to an embodiment, a thickness $t_2$ and $t_3$ of the at least one inorganic film 152 and 153 may be in a range of about 0.7 μm to about 1.5 μm. Each of the first inorganic film 152 and the second inorganic film 153 may have a thickness of about 0.7 μm to about 1.5 μm and may have substantially the same thickness. However, embodiments are not limited thereto. The first inorganic film 152 and the second inorganic film 153 may have different thicknesses within the above range.

When the thicknesses $t_2$ and $t_3$ of the inorganic films 152 and 153 are less than about 0.7 μm, it may be difficult to form the inorganic films 152 and 153 having a uniform thickness over an entire area, and it may be difficult to prevent penetration of moisture or oxygen into the OLED. When the thicknesses $t_2$ and $t_3$ of the inorganic films 152 and 153 are greater than about 1.5 μm, a manufacturing cost and a manufacturing time increase and the encapsulation structure 150 becomes thick. Thus, it is difficult to make the organic light-emitting display apparatus 1 slim and flexible.

According to an embodiment, the thickness $t_1$ of the organic film 151 may be about 6 μm, and the thicknesses $t_2$ and $t_3$ of the inorganic films 152 and 153 may be about 1 μm. That is, the external light reflectivity of the organic light-emitting display apparatus 1 including the encapsulation structure 150 may be minimized under the above condition.

According to an embodiment, the organic light-emitting display apparatus 1 may improve visibility by reducing reflection of external light by using the encapsulation structure including the inorganic films and the organic film each having a certain refractive index and thickness.

Figure 3:
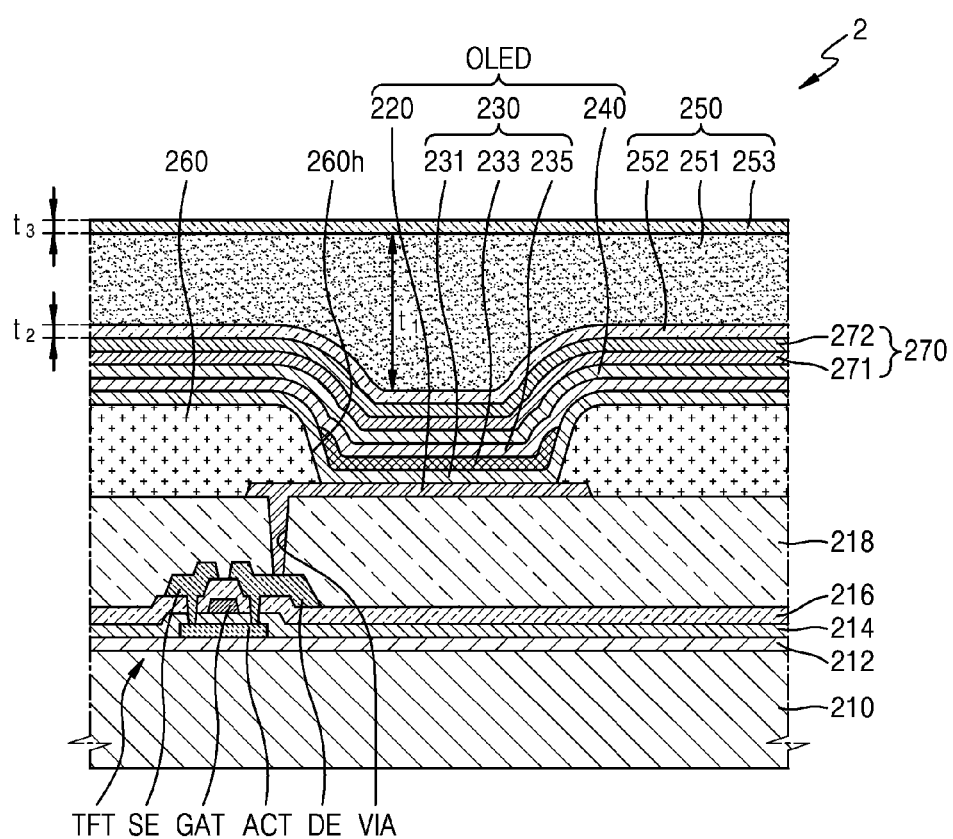
FIG. 3 is a schematic cross-sectional view of an organic light-emitting display apparatus according to an embodiment.

FIG. 3 is a schematic cross-sectional view of an organic light-emitting display apparatus according to an embodiment.

Referring to FIG. 3, the organic light-emitting display apparatus 2 according to an embodiment may include: a substrate 210; a pixel electrode 220 above the substrate 210; an intermediate layer 230 above the pixel electrode 220 and including an organic emission layer 233; an opposite electrode 240 above the intermediate layer 230; and an encapsulation structure 250 above the opposite electrode 240 and including at least one inorganic film 252 and 253 and at least one organic film 251, wherein a difference between a refractive index of the at least one inorganic film 252 and 253 and a refractive index of the at least one organic film 251 may be in a range of about 0.3 to about 0.5, and a thickness $t_1$ of the at least one organic film 251 may be in a range of about 3.5 μm to about 6.5 μm.

A pixel circuit may be between the substrate 210 and the OLED. The pixel circuit may drive the OLED and may include at least one thin film transistor (TFT).

The TFT may include an active layer ACT above the substrate 210, a gate electrode GAT above at least a portion of the active layer ACT and insulated from the active layer ACT, and a source electrode SE and a drain electrode DE above the gate electrode GAT and electrically connected to the active layer ACT.

A buffer layer 212 may be between the substrate 210 and the active layer ACT. A first insulating film 214 may be between the active layer ACT and the gate electrode GAT. A second insulating film 216 may be above the gate electrode GAT.

A third insulating film 218 may be above the second insulating film 216 to cover the source electrode SE and the drain electrode DE. The third insulating film 218 may include a via hole VIA exposing at least a portion of the drain electrode DE. The TFT may be electrically connected to the pixel electrode 220 through the via hole VIA.

According to an embodiment, the pixel electrode 220 may be a reflective electrode, and the opposite electrode 240 may be a transparent or translucent electrode. Light emitted from the organic emission layer 233 included in the intermediate layer 230 may pass through the opposite electrode 240 and be then emitted to the outside of the organic light-emitting display apparatus 2. That is, the organic light-emitting display apparatus 2 may be a top-emission type display apparatus.

According to an embodiment, the organic light-emitting display apparatus 2 may include a pixel defining film 260 including an opening 260h exposing at least a portion of the pixel electrode 220. The pixel defining film 260 may cover an edge of the pixel electrode 220 and define a pixel region. The pixel defining film 260 may include an organic material such as polyimide (PI).

The intermediate layer 230 may include an organic emission layer 233 and may further include a first common layer 231 between the pixel electrode 220 and the organic emission layer 233, and a second common layer 235 between the organic emission layer 233 and the opposite electrode 240. The first common layer 231 may be a hole injection layer (HIL) and/or a hole transport layer (HTL), and the second common layer 235 may be an electron transport layer (ETL) and/or an electron injection layer (EIL). However, embodiments are not limited thereto. The intermediate layer may further include other various function layers.

In a case where the OLED is a full-color OLED, the organic emission layer 233 may be patterned into a red emission layer, a green emission layer, and a blue emission layer according to a red pixel, a green pixel, and a blue pixel.

On the other hand, the organic emission layer 233 may have a multi-layered structure in which a red light-emitting layer, a green light-emitting layer, and a blue light-emitting layer are stacked, or a single-layered structure including a red light-emitting material, a green light-emitting material, and a blue light-emitting material. The OLED including the organic emission layer 233 may produce full colors by further including a red color filter, a green color filter, and a blue color filter.

A functional layer 270 that performs a function of improving characteristics of light emitted by the OLED may be further arranged between the opposite electrode 240 and the encapsulation structure 250. The functional layer 270 may include a capping layer 271 that performs a function of improving luminous efficiency through refractive index matching, and a cover layer 272 that protects the OLED from being damaged during a subsequent process using plasma, or the like. According to an embodiment, the capping layer 271 may include an organic material, and the cover layer 272 may include lithium fluoride (LiF).

The encapsulation structure 250 including at least one inorganic film 252 and 253 and at least one organic film 251 may be above the functional layer 270. A difference between a refractive index of the at least one inorganic film 252 and 253 and a refractive index of the at least one organic film 251 in the encapsulation structure 250 may be in a range of about 0.3 to about 0.5, and a thickness $t_1$ of the organic film 251 may be in a range of about 3.5 μm to about 6.5 μm. The organic film 251 may perform a function of planarizing a surface having a height difference formed by the pixel defining film 260. Thus, the thickness $t_1$ of the organic film 251 may be different according to a position thereof. As illustrated in FIG. 3, the thickness $t_1$ of the organic film 251 serving as a reference means a thickness of the organic film 251 that corresponds to a central portion of the pixel electrode 220 exposed by the pixel defining film 260.

According to an embodiment, the inorganic films 252 and 253 may include silicon nitride ($SiN_x$). The refractive index of the inorganic films 252 and 253 may be in a range of about 1.85 to about 1.95, and the refractive index of the organic film 251 may be in a range of about 1.45 to about 1.55. Also, the thickness $t_2$ and $t_3$ of the at least one inorganic film 252 and 253 may be in a range of about 0.7 µm to about 1.5 µm.

According to an embodiment, the thickness $t_1$ of the organic film 251 may be about 6 µm, and the thicknesses $t_2$ and $t_3$ of the at least one inorganic film 252 and 253 may be about 1 µm. That is, the external light reflectivity of the organic light-emitting display apparatus 2 including the encapsulation structure 250 may be minimized under the above condition.

The refractive indices of the inorganic films 252 and 253 and the organic film 251, the thickness $t_1$ of the organic film 251, and the thicknesses $t_2$ and $t_3$ of the inorganic films 252 and 253 are substantially identical to those of the organic light-emitting display apparatus 1 of FIG. 1, redundant descriptions thereof will be omitted.

Figure 4:
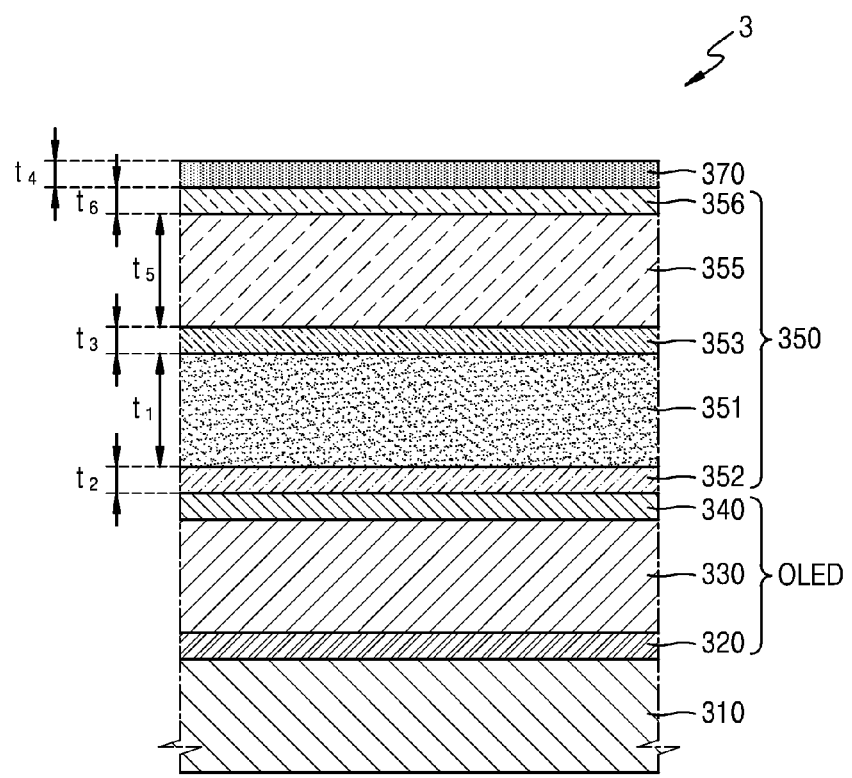
FIG. 4 is a schematic cross-sectional view of an organic light-emitting display apparatus according to an embodiment.
Figure 5A:
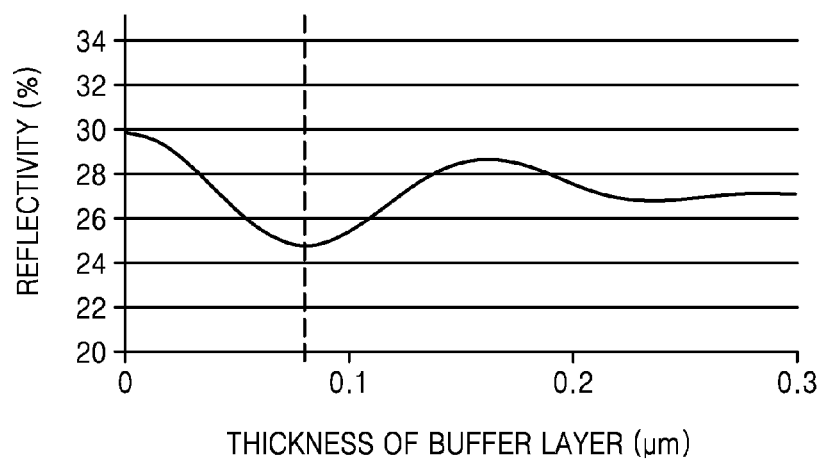
FIGS. 5A and 5B are respectively graphs showing reflectivity of external light with respect to a thickness and a refractive index of a buffer layer included in the organic light-emitting display apparatus of FIG. 4.
Figure 5B:
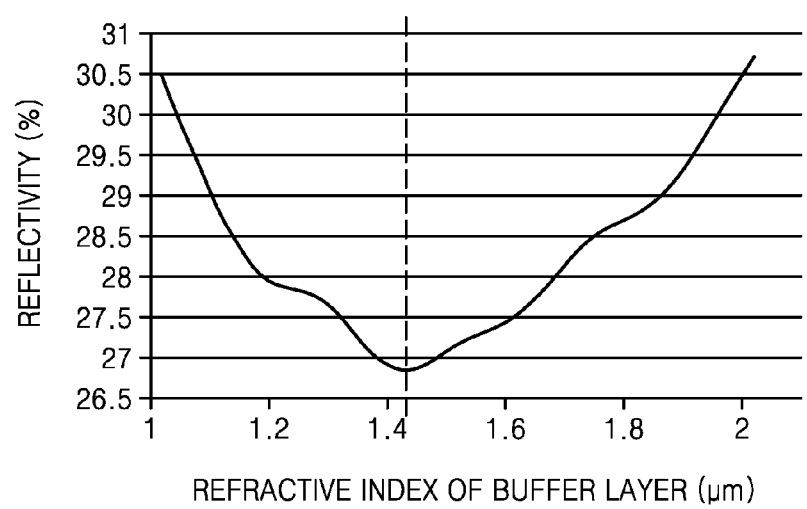

FIG. 4 is a schematic cross-sectional view of an organic light-emitting display apparatus 3 according to an embodiment, and FIGS. 5A and 5B are respectively graphs showing external light reflectivity with respect to a thickness and a refractive index of a buffer layer included in the organic light-emitting display apparatus 3 of FIG. 4.

Referring to FIG. 4, the organic light-emitting display apparatus 3 according to an embodiment may include: a substrate 310; a pixel electrode 320 above the substrate 310; an intermediate layer 330 above the pixel electrode 320 and including an organic emission layer; an opposite electrode 340 above the intermediate layer 330; and an encapsulation structure 350 above the opposite electrode 340 and including at least one inorganic film 352, 353, and 356 and at least one organic film 351 and 355, wherein a difference between a refractive index of the at least one inorganic film 352, 353, and 356 and a refractive index of the at least one organic film 351 and 355 may be in a range of about 0.3 to about 0.5, and a thickness $t_1$ and $t_5$ of the at least one organic film 351 and 355 may be in a range of about 3.5 µm to about 6.5 µm.

According to an embodiment, the pixel electrode 320 may be a reflective electrode, and the opposite electrode 340 may be a transparent or translucent electrode. Light emitted from the organic emission layer included in the intermediate layer 330 may pass through the opposite electrode 340 and be then emitted to the outside of the organic light-emitting display apparatus 3. That is, the organic light-emitting display apparatus 3 may be a top-emission type display apparatus.

The intermediate layer 330 may include an organic emission layer and may further include other various function layers. The encapsulation structure 350 including at least one inorganic film 352, 353, and 356 and at least one organic film 351 and 355 may be above the opposite electrode 340. A difference between a refractive index of the at least one inorganic film 352, 353, and 356 and a refractive index of the at least one organic film 351 and 355 in the encapsulation structure 350 may be in a range of about 0.3 to about 0.5. According to an embodiment, the encapsulation structure 350 may include a first inorganic film 352, a first organic film 351, a second inorganic film 353, a second organic film 355, and a third inorganic film 356, which are sequentially stacked above the opposite electrode 340.

A thickness $t_1$ of the first and second organic film 351 and a thickness $t_2$ of the second organic film 355 may be in a range of about 3.5 µm to about 6.5 µm. According to an embodiment, the first inorganic film 352, the second inorganic film 353, and the third inorganic film 356 may include silicon nitride ($SiN_x$). The refractive indices of the first inorganic film 352, the second inorganic film 353, and the third inorganic film 356 may be in a range of about 1.85 to about 1.95, and the refractive indices of the first organic film 351 and the second organic film 355 may be in a range of about 1.45 to about 1.55. Also, the thicknesses $t_2$, $t_3$, and $t_6$ of the first inorganic film 352, the second inorganic film 353, and the third inorganic film 356 may be in a range of about 0.7 µm to about 1.5 µm.

The refractive indices of the inorganic films 352, 353, and 356 and the organic films 351 and 355, the thicknesses $t_1$ and $t_5$ of the organic films 351 and 355, and the thicknesses $t_2$, $t_3$, and $t_6$ of the inorganic films 352, 353, and 356 are substantially identical to those of the organic light-emitting display apparatus 1 of FIG. 1, redundant descriptions thereof will be omitted.

A buffer layer 370 may be above the encapsulation structure 350. The buffer layer 370 may come into direct contact with the third inorganic film 356 in the uppermost portion of the encapsulation structure 350. The third inorganic film 356 may have a high refractive index of about 1.85 to 1.95. In a case where a low-refractive-index layer is above the third inorganic film 356, external light may be reflected from an interface between the low-refractive-index layer and the third inorganic film 356. The buffer layer 370 may reduce interfacial reflection by reducing a difference between a refractive index of the third inorganic film 356 and a refractive index of the low-refractive-index layer above the third inorganic film 356. Thus, the buffer layer 370 may serve to reduce external reflection reflectivity.

Figure 6:
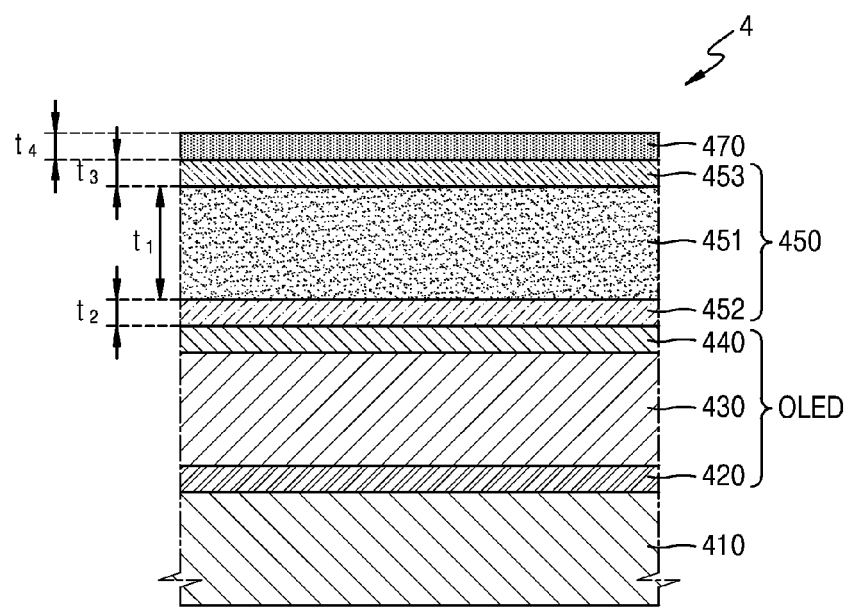
FIG. 6 is a schematic cross-sectional view of an organic light-emitting display apparatus according to an embodiment.
Figure 7:
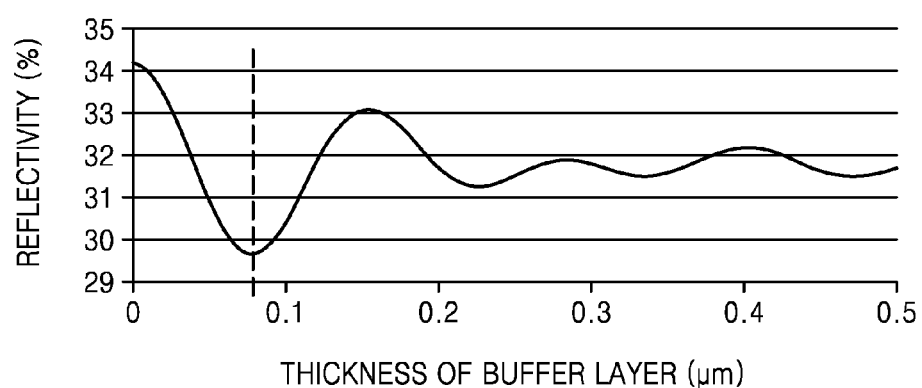
FIG. 7 is a graph showing reflectivity of external light with respect to a thickness of a buffer layer included in the organic light-emitting display apparatus of FIG. 6.

FIG. 6 is a schematic cross-sectional view of an organic light-emitting display apparatus 4 according to an embodiment, and FIG. 7 is a graph showing external light reflectivity with respect to a thickness of a buffer layer included in the organic light-emitting display apparatus of FIG. 6.

Referring to FIG. 6, the organic light-emitting display apparatus 4 according to an embodiment may include: a substrate 410; a pixel electrode 420 above the substrate 410; an intermediate layer 430 above the pixel electrode 420 and including an organic emission layer; an opposite electrode 440 above the intermediate layer 430; and an encapsulation structure 450 above the opposite electrode 440 and including at least one inorganic film 452 and 453 and at least one organic film 451, wherein a difference between a refractive index of the at least one inorganic film 452 and 453 and a refractive index of the at least one organic film 451 may be in a range of about 0.3 to about 0.5, and a thickness $t_1$ of the at least one organic film 451 may be in a range of about 3.5 µm to about 6.5 µm.

According to an embodiment, the pixel electrode 420 may be a reflective electrode, and the opposite electrode 440 may be a transparent or translucent electrode. Light emitted from the organic emission layer included in the intermediate layer 430 may pass through the opposite electrode 440 and be then emitted to the outside of the organic light-emitting display apparatus 4. That is, the organic light-emitting display apparatus 4 may be a top-emission type display apparatus.

The intermediate layer 430 may include an organic emission layer and may further include other various function layers. The encapsulation structure 450 including at least one inorganic film 452 and 453 and at least one organic film 451 may be above the opposite electrode 440. A difference between a refractive index of the at least one inorganic film 452 and 453 and a refractive index of the at least one organic film 451 in the encapsulation structure 450 may be in a range of about 0.3 to about 0.5, and a thickness $t_1$ of the organic film 451 may be in a range of about 3.5 µm to about 6.5 µm. According to an embodiment, the inorganic films 452 and 453 may include silicon nitride ($SiN_x$). The refractive index of the inorganic films 452 and 453 may be in a range of about 1.85 to about 1.95, and the refractive index of the organic film 451 may be in a range of about 1.45 to about 1.55. Also, the thickness $t_2$ and $t_3$ of the at least one inorganic film 452 and 453 may be in a range of about 0.7 μm to about 1.5 μm.

The refractive indices of the inorganic films 452 and 453 and the organic film 451, the thickness $t_1$ of the organic film 451, and the thicknesses $t_2$ and $t_3$ of the inorganic films 452 and 453 are substantially identical to those of the organic light-emitting display apparatus 1 of FIG. 1, redundant descriptions thereof will be omitted.

According to an embodiment, the encapsulation structure 450 may include a first inorganic film 452, a first organic film 451, and a second inorganic film 453, which are sequentially stacked above the opposite electrode 440. The second inorganic film 453 may be a layer in the uppermost portion of the encapsulation structure 450.

A buffer layer 470 coming into direct contact with the second inorganic film 453 may be above the encapsulation structure 350. The second inorganic film 453 may have a high refractive index of about 1.85 to 1.95. In a case where a low-refractive-index layer is above the second inorganic film 453, external light may be reflected from an interface between the low-refractive-index layer and the second inorganic film 453. The buffer layer 470 may reduce interfacial reflection by reducing a difference between a refractive index of the second inorganic film 453 and a refractive index of the low-refractive-index layer above the second inorganic film 453. Thus, the buffer layer 470 may serve to reduce external reflection reflectivity.

It can be seen from FIG. 7 that external light reflectivity changes according to a thickness $t_4$ of the buffer layer 470. When the thickness $t_4$ of the buffer layer 470 is in a range of about 50 nm to about 80 nm, external light reflectivity may become minimum. The buffer layer 470 may include silicon oxynitride (SiON), silicon oxide (SiO$_2$), or an organic material, which has a refractive index of about 1.33 to about 1.5.

It can be seen that the external light reflectivity is 30% or less when the thickness $t_4$ of the buffer layer 470 having a certain refractive index is in a range of about 50 nm to about 80 nm, the thicknesses $t_2$ and $t_3$ of the first and second inorganic films 452 and 453 are in a range of about 0.7 μm to about 1.5 μm, and the thickness $t_1$ of the first organic film 451 is in a range of about 3.5 μm to about 6.5 μm. Although not illustrated, the organic light-emitting display apparatus 4 according to the embodiment may further include an anti-reflection layer such as a circular polarization film above the buffer layer 470. Since the anti-reflection layer additionally reduces the external light reflectivity, the external light reflectivity of 5% or less may be realized.

According to the above-described embodiments, the organic light-emitting display apparatuses 1, 2, 3, and 4 may improve visibility by reducing reflection of external light by using the encapsulation structure including the inorganic films and the organic films each having a certain refractive index and thickness.

According to one or more embodiments, the organic light-emitting display apparatus is capable of reducing reflection of external light by using an encapsulation structure including an inorganic film and an organic film each having a certain refractive index and a certain thickness. It is obvious that these effects are not intended to limit the scope of the inventive concept.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
   a substrate;
   a pixel electrode above the substrate;
   an intermediate layer above the pixel electrode and comprising an organic emission layer;
   an opposite electrode above the intermediate layer;
   an encapsulation structure above the opposite electrode and comprising at least one inorganic film and at least one organic film,
   a capping layer between the opposite electrode and the encapsulation structure and contacting with the opposite electrode; and
   a cover layer above the capping layer;
   wherein a difference between a refractive index of the at least one inorganic film and a refractive index of the at least one organic film is in a range between about 0.3 to about 0.5,
   a thickness of the at least one inorganic film is in a range of about 0.7 μm to about 1.5 μm, and
   a thickness of the at least one organic film is in a range of about 3.5 μm to about 6.5 μm.

2. The organic light-emitting display apparatus of claim 1, wherein the encapsulation structure comprises a first inorganic film, a first organic film, and a second inorganic film, which are sequentially stacked above the opposite electrode.

3. The organic light-emitting display apparatus of claim 1, wherein the at least one inorganic film comprises silicon nitride (SiNx).

4. The organic light-emitting display apparatus of claim 1, wherein the thickness of the at least one organic film is about 6 μm, and the thickness of the at least one inorganic film is about 1 μm.

5. The organic light-emitting display apparatus of claim 1, wherein the at least one inorganic film is in an uppermost portion of the encapsulation structure, and the refractive index of the at least one inorganic film is in a range of about 1.85 to about 1.95.

6. The organic light-emitting display apparatus of claim 5, further comprising a buffer layer above the encapsulation structure and contacting with the at least one inorganic film.

7. The organic light-emitting display apparatus of claim 6, wherein a thickness of the buffer layer is in a range of about 50 nm to about 80 nm, and a refractive index of the buffer layer is in a range of about 1.33 to about 1.5.

8. The organic light-emitting display apparatus of claim 6, wherein the buffer layer comprises silicon oxynitride (SiON), silicon oxide (SiO2), or an organic material.

9. The organic light-emitting display apparatus of claim 1, wherein the encapsulation structure comprises a first inorganic film, a first organic film, a second inorganic film, a second organic film, and a third inorganic film, which are sequentially stacked above the opposite electrode.

10. The organic light-emitting display apparatus of claim 1, further comprising:
    a pixel defining film comprising an opening exposing at least a portion of the pixel electrode.

11. The organic light-emitting display apparatus of claim 1, wherein the pixel electrode is a reflective electrode configured to reflect light, and the opposite electrode is a transparent or translucent electrode configured to transmit at least a part of light.

12. An organic light-emitting display apparatus comprising:
 a substrate;
 a pixel electrode above the substrate;
 an intermediate layer above the pixel electrode and comprising an organic emission layer;
 an opposite electrode above the intermediate layer;
 an encapsulation structure above the opposite electrode and comprising at least one inorganic film and at least one organic film; and
 a buffer layer above the encapsulation structure,
 wherein a thickness of the at least one inorganic film is in a range of about 0.7 μm to about 1.5 μm,
 a thickness of the at least one organic film is in a range of about 3.5 μm to about 6.5 μm, and
 a thickness of the buffer layer is in a range of about 50 μm to about 80 μm.

13. The organic light-emitting display apparatus of claim 12, wherein a difference between a refractive index of the at least one inorganic film and a refractive index of the at least one organic film is in a range of about 0.3 to about 0.5, and a refractive index of the buffer layer is less than the refractive index of the at least one inorganic film.

14. The organic light-emitting display apparatus of claim 13, wherein the refractive index of the at least one inorganic film is in a range of about 1.85 to about 1.95, the refractive index of the at least one organic film is in a range of about 1.45 to about 1.55, and the refractive index of the buffer layer is in a range of about 1.33 to about 1.5.

15. The organic light-emitting display apparatus of claim 14, wherein the at least one inorganic film comprises silicon nitride (SiNx).

16. The organic light-emitting display apparatus of claim 14, wherein the buffer layer comprises silicon oxynitride (SiON), silicon oxide (SiO2), or an organic material.

17. The organic light-emitting display apparatus of claim 14, further comprising:
 a capping layer between the opposite electrode and the encapsulation structure and contacting with the opposite electrode; and
 a cover layer above the capping layer.

18. The organic light-emitting display apparatus of claim 14, wherein the encapsulation structure comprises a first inorganic film, a first organic film, and a second inorganic film, which are sequentially stacked above the opposite electrode.

* * * * *